(12) United States Patent
Frosien

(10) Patent No.: US 9,202,666 B1
(45) Date of Patent: Dec. 1, 2015

(54) METHOD FOR OPERATING A CHARGED PARTICLE BEAM DEVICE WITH ADJUSTABLE LANDING ENERGIES

(71) Applicant: ICT Integrated Circuit Testing Gesellschaft für Halbleiterprüftechnik mbH, Heimstetten (DE)

(72) Inventor: Jürgen Frosien, Riemerling (DE)

(73) Assignee: ICT Integrated Circuit Testing Gesellschaft für Halbleiterprüftechnik mbh, Heimstetten (DE)

( * ) Notice: Subject to any disclaimer, the term of this patent is extended or adjusted under 35 U.S.C. 154(b) by 0 days.

(21) Appl. No.: 14/340,335

(22) Filed: Jul. 24, 2014

(51) Int. Cl.
*H01J 37/00* (2006.01)
*H01J 37/147* (2006.01)
*H01J 37/28* (2006.01)

(52) U.S. Cl.
CPC .............. *H01J 37/147* (2013.01); *H01J 37/28* (2013.01)

(58) Field of Classification Search
USPC ......................................................... 250/307
See application file for complete search history.

(56) References Cited

U.S. PATENT DOCUMENTS

| | | | |
|---|---|---|---|
| 6,593,152 B2 * | 7/2003 | Nakasuji et al. | 438/14 |
| 7,420,164 B2 * | 9/2008 | Nakasuji et al. | 250/307 |
| 8,497,476 B2 * | 7/2013 | Hatakeyama et al. | 250/310 |

*Primary Examiner* — Phillip A Johnston
(74) *Attorney, Agent, or Firm* — Kilpatrick Townsend & Stockton LLP

(57) ABSTRACT

A method of operating a charged particle beam device is provided. The charged particle beam device includes a beam separator that defines an optical axis, and includes a magnetic beam separation portion and an electrostatic beam separation portion. The method includes generating a primary charged particle beam, and applying a voltage to a sample, the voltage being set to a first value to determine a first landing energy of the primary charged particle beam. The method further includes creating an electric current in the magnetic beam separation portion, the current being set to a first value to generate a first magnetic field, and applying a voltage to the electrostatic beam separation portion, the voltage being set to a first value to generate a first electric field. The method includes guiding the primary charged particle beam to the beam separator, wherein the primary charged particle beam enters the beam separator at a first angle relative to the optical axis and, under the influence of the first magnetic field and the first electric field, leaves the beam separator at a second angle relative to the optical axis. The method includes generating a secondary charged particle beam by impingement of the primary charged particle beam on the sample to which the voltage with the first value is applied, and separating the secondary charged particle beam from the primary charged particle beam in the beam separator, wherein the secondary charged particle beam enters the beam separator at a third angle relative to the optical axis and, under the influence of the first magnetic field and the first electric field, leaves the beam separator at a fourth angle relative to the optical axis. The first angle and the fourth angle are different. The method further includes applying the voltage to the sample, the voltage being set to a second value to determine a second landing energy of the primary charged particle beam, creating the electric current in the magnetic beam separation portion, the electric current being set to a second value to generate a second magnetic field, applying the voltage to the electrostatic beam separation portion, the voltage being set to a second value to generate a second electric field, guiding the primary charged particle beam to the beam separator, wherein the primary charged particle beam enters the beam separator at the first angle relative to the optical axis and, under the influence of the second magnetic field and the second electric field, leaves the beam separator at the second angle relative to the optical axis, generating the secondary charged particle beam by impingement of the primary charged particle beam on the sample to which the voltage with the second value is applied, and separating the secondary charged particle beam from the primary charged particle beam in the beam separator, wherein the secondary charged particle beam enters the beam separator at the third angle relative to the optical axis and, under the influence of the second magnetic field and the second electric field, leaves the beam separator at the fourth angle relative to the optical axis.

20 Claims, 8 Drawing Sheets

METHOD FOR OPERATING A CHARGED PARTICLE BEAM DEVICE WITH ADJUSTABLE LANDING ENERGIES

FIELD

The present disclosure relates to a charged particle device, e.g. for imaging and/or manipulating a sample, and a method of operating the charged particle beam device. Specifically, embodiments described herein relate to a charged particle beam device which includes a beam separator for separating primary charged particles from secondary charged particles generated by impingement of the primary charged particle beam onto the sample.

BACKGROUND

Charged particle beam systems are widely spread in the semiconductor industry. Examples of charged particle beam devices are electron microscopes such as secondary electron microscopes (SEM), electron beam pattern generators, ion microscopes as well as ion beam pattern generators. Charged particle beams, in particular electron beams, offer superior spatial resolution compared to photon beams, due to their short wavelengths at comparable particle energy.

Charged particle beam systems are used for quality evaluations and control of semiconductor processes, e.g. for inspection of critical dimensions (CD), defect review (DR), or wafer and mask defect inspection. For these tools special low voltage electron optical columns have been developed, in particular SEM-based devices, which either deliver high resolution having electron probes with nanometer and sub-nanometer diameters for CD & DR, or generate high current density electron probes for wafer & mask inspection or hot spot inspection. Because of the high requirements regarding probe size and/or probe current density the focus in the electron optics development was on the optimization of the primary electron beam (PE) optics. Efforts have been made to reduce/optimize the lens aberrations (mainly spherical and chromatic aberration) as well as electron-electron interaction. Recently also some focus was directed on the SE detection, since optimized detection will improve not only the contrast which eases image analysis but also reduces image acquisition time. The latter improves throughput which is of high importance in particular in electron beam inspection (EBI) and HS applications.

In this context, separation of the PE beam and the signal electron (SE) beam, including secondary electrons and backscattered electrons, has been introduced which enables an off-axis detection. Such off-axis detection allows an optimization of the detector independently of constraints imposed by the PE beam. The related SE beam path may be generated by a beam separator for separating the SE beam from the PE beam, followed by a beam bender to increase the SE beam separation from the PE beam. A large separation eases the SE beam detection, in particular by generating space for the SE detector and/or additional SE optics.

The beam bender and SE optics are at a fixed spatial positions, e.g., located on a fixed axis. The PE optics is optimized and aligned for constant column energy, and the excitation of beam shaping elements is fixed. Then, SE beam alignment with the bender and the subsequent SE optics is provided for the chosen operation condition.

In order to choose a different imaging mode, one may change the landing energy of the PE beam by changing the sample bias. However, if the landing energy of the PE beam is changed in this way, the SE beam energy will also change and the SE beam separation angle will vary. In addition, secondary electrons and backscattered electrons will have different separation angles due to their different energies. As a consequence, the SE beam will pass off-axis through the beam bender and subsequent SE optics. Such deviations lead to aberrations in the SE beam path and will disturb the imaging quality of the SE beam.

Consequently, there is a need for an improved charged particle beam device and method of operating the same.

SUMMARY

According to an embodiment, a method of operating a charged particle beam device is provided. The charged particle beam device includes a beam separator that defines an optical axis, and includes a magnetic beam separation portion and an electrostatic beam separation portion. The method includes generating a primary charged particle beam, and applying a voltage to a sample, the voltage being set to a first value to determine a first landing energy of the primary charged particle beam. The method further includes creating an electric current in the magnetic beam separation portion, the current being set to a first value to generate a first magnetic field, and applying a voltage to the electrostatic beam separation portion, the voltage being set to a first value to generate a first electric field. The method includes guiding the primary charged particle beam to the beam separator, wherein the primary charged particle beam enters the beam separator at a first angle relative to the optical axis and, under the influence of the first magnetic field and the first electric field, leaves the beam separator at a second angle relative to the optical axis. The method includes generating a secondary charged particle beam by impingement of the primary charged particle beam on the sample to which the voltage with the first value is applied, and separating the secondary charged particle beam from the primary charged particle beam in the beam separator, wherein the secondary charged particle beam enters the beam separator at a third angle relative to the optical axis and, under the influence of the first magnetic field and the first electric field, leaves the beam separator at a fourth angle relative to the optical axis. The first angle and the fourth angle are different. The method further includes applying the voltage to the sample, the voltage being set to a second value to determine a second landing energy of the primary charged particle beam, creating the electric current in the magnetic beam separation portion, the electric current being set to a second value to generate a second magnetic field, applying the voltage to the electrostatic beam separation portion, the voltage being set to a second value to generate a second electric field, guiding the primary charged particle beam to the beam separator, wherein the primary charged particle beam enters the beam separator at the first angle relative to the optical axis and, under the influence of the second magnetic field and the second electric field, leaves the beam separator at the second angle relative to the optical axis, generating the secondary charged particle beam by impingement of the primary charged particle beam on the sample to which the voltage with the second value is applied, and separating the secondary charged particle beam from the primary charged particle beam in the beam separator, wherein the secondary charged particle beam enters the beam separator at the third angle relative to the optical axis and, under the influence of the second magnetic field and the second electric field, leaves the beam separator at the fourth angle relative to the optical axis.

According to another embodiment, a method of operating a charged particle beam device is provided. The charged particle beam device includes a beam separator which includes a magnetic beam separation portion and an electrostatic beam separation portion. The method includes generating a primary charged particle beam, applying a sample voltage to a sample, the sample voltage being set to a selected sample voltage value to determine a landing energy of the primary charged particle beam, and calculating a first electric current value from a primary reference angle, a secondary reference angle and the sample voltage value. Therein, the primary reference angle corresponds to a target deflection of the primary charged particle beam in the beam separator and the secondary reference angle corresponds to a target deflection of a secondary charged particle beam in the beam separator. The method includes creating an electric current in the magnetic beam separation portion, the electric current being set to the calculated first electric current value to generate a first magnetic field. The method further includes calculating a first voltage value from the primary reference angle, the secondary reference angle and the sample voltage, and applying a voltage to the electrostatic beam separation portion, the voltage being set to the calculated first voltage value to generate a first electric field. The method includes guiding the primary charged particle beam through the beam separator, wherein the primary charged particle beam is deflected in the beam separator under the influence of the first magnetic field and the first electric field, wherein the primary charged particle beam is deflected by the primary reference angle. The method further includes generating the secondary charged particle beam by impingement of the primary charged particle beam on the sample, and separating the secondary charged particle beam from the primary charged particle beam in the beam separator, wherein the secondary charged particle beam is deflected in the beam separator under the influence of the first magnetic field and the first electric field, and wherein the secondary charged particle is deflected by the secondary reference angle.

According to a further embodiment, a charged particle beam device is provided. The charged particle beam device includes a beam emitter for emitting a primary charged particle beam, a sample voltage source configured for applying a sample voltage to a sample to adjust a landing energy of the primary charged particle beam on the sample, and a beam separator including an electrostatic beam separation portion and a magnetic beam separation portion. The charged particle beam device further includes a processing unit configured to calculate a first electric current value and a first voltage value from a primary reference angle, a secondary reference angle and a first value of the sample voltage, wherein the primary reference angle corresponds to a target deflection of the primary charged particle beam in the beam separator, and the secondary reference angle corresponds to a target deflection, in the beam separator, of a secondary charged particle beam emitted by impingement of the primary charged particle beam on the sample that is biased by the first value of the sample voltage. The charged particle beam device further includes an electric current source adapted for creating an electric current in the magnetic beam separation portion, the electric current being set to the first electric current value to generate a first magnetic field and a voltage source adapted for applying a voltage to the electrostatic beam separation portion, the voltage being set to the first voltage value to generate a first electric field. Therein, if the electric current created in the magnetic beam separation portion is set to the first electric current value and the voltage applied to the electrostatic beam separation portion is set to the first voltage value, the beam separator separating the primary charged particle beam from the secondary charged particle beam is configured for deflecting the primary charged particle beam by the primary reference angle under the influence of the first electric field generated in the electrostatic beam separation portion and the first magnetic field generated in the magnetic beam separation portion, and deflecting the secondary charged particle beam by the secondary reference angle under the influence of the first electric field and first the magnetic field.

Embodiments are also directed to methods for operating the disclosed system. These method steps may be performed manually or automated, e.g. controlled by a computer programmed by appropriate software, by any combination of the two or in any other manner.

Further advantages, features, aspects and details that can be combined with embodiments described herein are evident from the dependent claims, the description and the drawings.

BRIEF DESCRIPTION OF THE DRAWINGS

A full and enabling disclosure to one of ordinary skill in the art is set forth more particularly in the remainder of the specification including reference to the accompanying drawings wherein.

DETAILED DESCRIPTION

Figure 1:
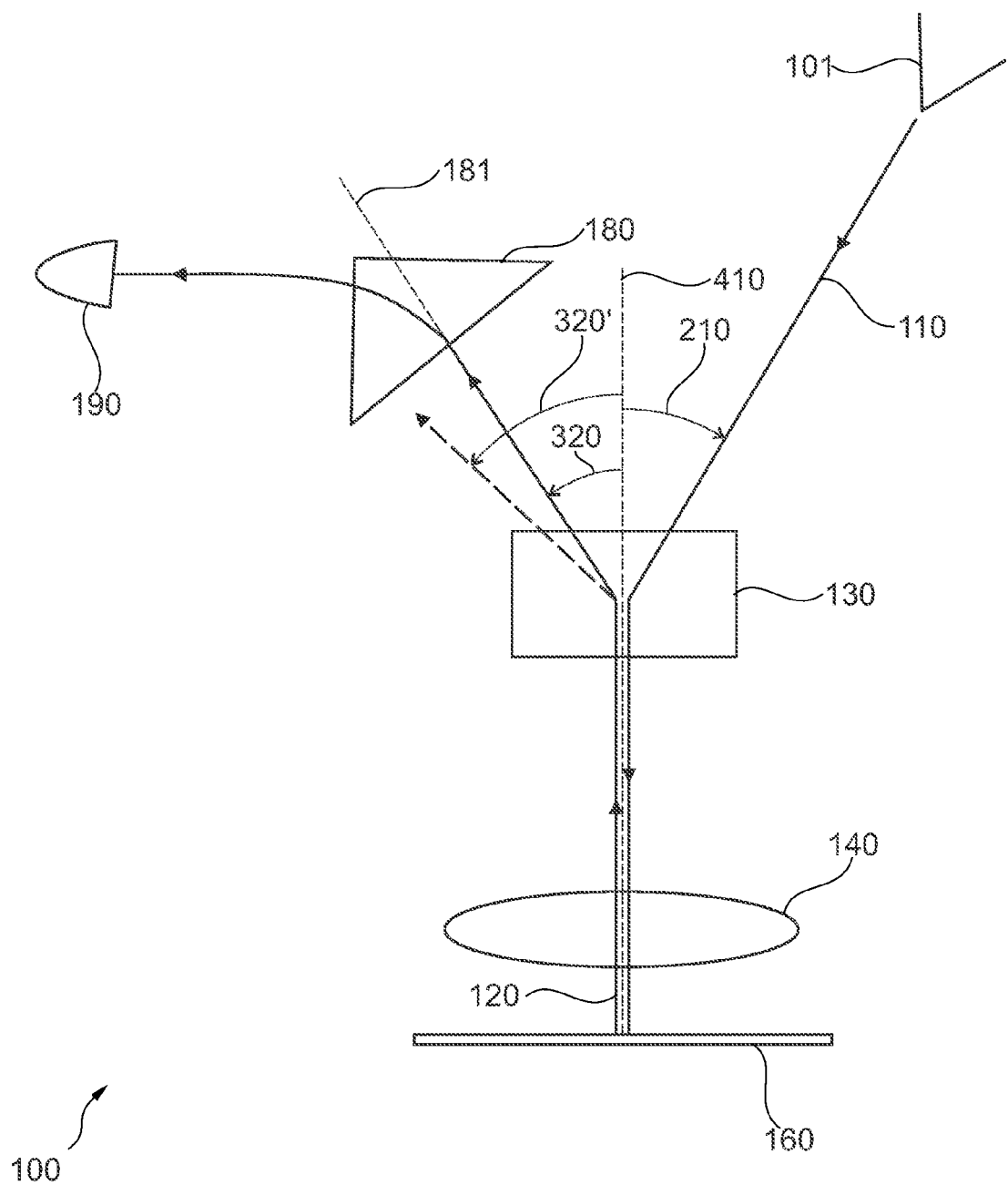
FIG. 1 shows a set-up for a charged particle beam system.

Reference will now be made in detail to the various exemplary embodiments, one or more examples of which are illustrated in each figure. Each example is provided by way of explanation and is not meant as a limitation. For example, features illustrated or described as part of one embodiment can be used on or in conjunction with other embodiments to yield yet further embodiments. It is intended that the present disclosure includes such modifications and variations.

Within the following description of the drawings, the same reference numbers refer to the same components. Generally, only the differences with respect to the individual embodiments are described. The structures shown in the drawings are not necessarily depicted true to scale but rather serve the better understanding of the embodiments.

The term "sample", as used herein, may include, but is not limited to, semiconductor wafers, semiconductor workpieces, and other workpieces such as memory disks and the like. Embodiments may be applied to any workpiece on which material is deposited, which is inspected or which is structured. A sample may include a surface to be structured, imaged or on which layers are deposited. The term "charged particles", as used herein, may include electrons, ions, atoms, or other charged particles. The term "primary charged particles" refers to charged particles being emitted by a beam emitter and being directed onto a sample. The term "secondary charged particles" refers to charged particles created at or in the sample, and/or backscattered charged particles. If the secondary charged particles are electrons, the secondary charged particles may e.g. include Auger electrons and backscattered electrons. Secondary electrons/charged particles are also referred to as signal electrons/charged particles.

A set-up for a charged particle beam system 100 is shown in FIG. 1. The system 100 includes a beam emitter 101 for emitting charged particles. The beam emitter may e.g. be an electron gun. The primary charged particle beam 110 emitted from the beam emitter travels from the beam emitter to a beam separator 130. The primary charged particle beam 110 is deflected in the beam separator 130 and subsequently travels from the beam separator to an objective lens 140 adapted for focusing the primary charged particle beam onto a sample 160.

Upon impingement of the primary charged particle beam 110 on the sample 160, a secondary charged particle beam 120 is generated, as shown in FIG. 1. The secondary charged particle beam 110 travels from the sample 160 to the beam separator 130, wherein the secondary charged particle beam 120 travels in substantially the opposite direction of the primary charged particle beam 110. The beam separator 130 acts on the primary and secondary charged particle beams and is adapted for separating the primary charged particle beam from the secondary charged particle beam. As shown, the secondary charged particle beam 120 is deflected in the beam separator 130, wherein the deflection is such that the secondary charged particle beam leaving the beam separator is directed away from the primary charged particle beam 110. The secondary charged particle beam 120 may travel from the beam separator to an optical element 180. In the exemplary system shown in FIG. 1, the optical element 180 is a beam bender adapted to guide the secondary charged particle beam 120 further away from the primary charged particle beam 110. After passing through optical element 180, the secondary charged particle beam 120 is guided to a detector assembly 190.

The primary charged particle beam 110 enters the beam separator 130 at a first angle 210 relative to an optical axis 410. The optical axis 410 may be defined by the objective lens 140 and/or the beam separator 130. As shown in FIG. 1, the first angle is a nonzero angle, so that the primary charged particle beam is non-parallel to the optical axis when entering the beam separator. In particular, the first angle shown in FIG. 1 is a positive nonzero angle.

Figure 2:
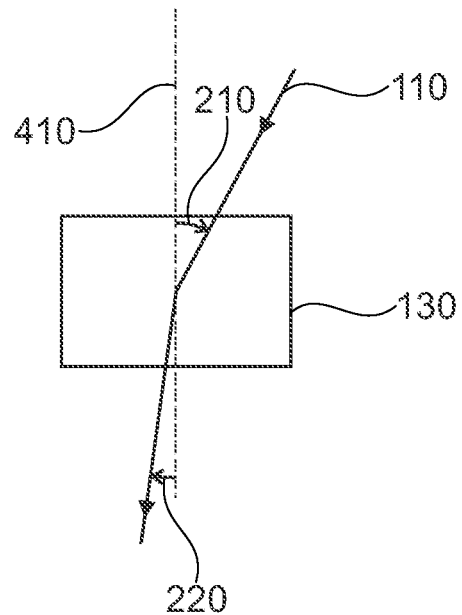
FIG. 2 shows a primary charged particle beam being deflected by a beam separator.

In the exemplary system shown in FIG. 1, the primary charged particle beam 110, when traveling from the beam separator 130 to the sample 160 via the objective lens 140, travels along the optical axis 410. Generally, the primary charged particle beam may leave the beam separator at a zero or nonzero angle relative to the optical axis. This is illustrated in FIG. 2 which shows a primary charged particle beam entering a beam separator at a first angle 210 relative to an optical axis 410 and leaving the beam separator at a second angle 220 relative to the optical axis 410. The second angle 210 shown in FIG. 2 is a nonzero angle, such that the primary charged particle beam is non-parallel to the optical axis 410 upon leaving the beam separator.

Figure 3:
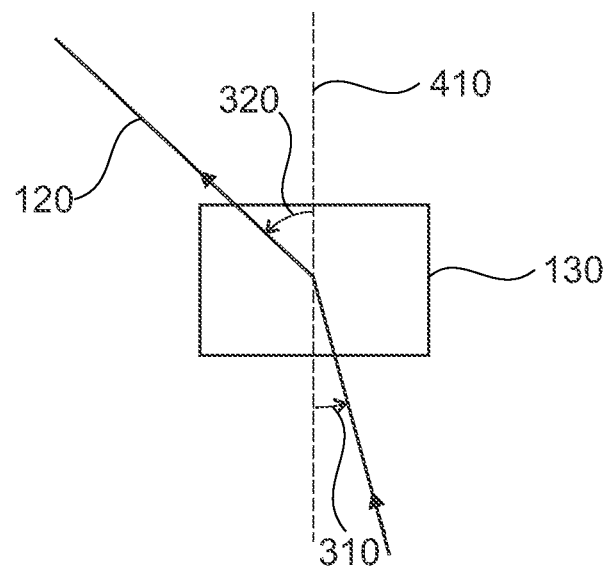
FIG. 3 shows a secondary charged particle beam being deflected by a beam separator.

In the exemplary system 100 shown in FIG. 1, the secondary charged particle beam 120, when traveling from the sample 160 to the beam separator 130 through the objective lens 140, travels along the optical axis 410. Generally, a secondary charged particle beam may enter the beam separator at a zero or nonzero angle relative to the optical axis. This is illustrated in FIG. 3 which shows a secondary charged particle beam entering a beam separator at a third angle 310 relative to an optical axis 410. The third angle 310 shown in FIG. 3 is a nonzero angle, such that the secondary charged particle beam is non-parallel to the optical axis 410 when entering the beam separator. The third angle 310 may be different from the second angle 220 as shown in FIGS. 2 and 3 or may be the same angle. As further shown in FIG. 3, the secondary charged particle beam leaves the beam separator at a fourth angle 320 which, in the exemplary system shown, is a nonzero angle, more specifically a nonzero negative angle.

Some elements included in a charged particle beam device may be spatially arranged in a fixed position in the charged particle beam device. The spatial arrangement of such elements may determine one or more target axes along which the primary and/or secondary charged particle beams are to travel within the charged particle device. A charged particle beam deviating from a target axis may lead to a poor image quality of the sample.

In particular, the spatial arrangement of secondary charged particle beam elements, e.g., a beam bender and/or secondary charged particle beam optics, may determine a target axis along which the secondary charged particle beam should preferably travel upon leaving the beam separator. Accordingly, a target deflection angle may be determined for the deflection of the secondary charged particle beam in the beam separator. As an example, referring to FIG. 1, the relative position of optical element 180 with respect to beam separator 130 may be fixed. The optical element 180 may be next element influencing the secondary charged particle beam after the beam separator, i.e., the optical element may be arranged directly downstream of the beam separator. A target direction 181 may be defined by the optical element 180 along which the secondary charged particle beam should travel from the beam separator 130 to the optical element 180.

Under predetermined operating conditions, the secondary charged particle beam can be made to propagate along the target direction 181 when leaving the beam separator. But, when the landing energy of the primary charged particle beam is changed by changing the sample voltage in order to probe the sample at different energies and to potentially resolve different structures on the sample, the secondary charged particle beam may no longer propagate along the target direction 181, but may deviate therefrom. The secondary charged particle beam would be deflected in the beam separator 130 by an angle 320' different from the target deflection angle 320 as shown in FIG. 1. As a consequence, the secondary charged particle beam 120 may pass off-axis through the optical element 180, and such deviations may lead to aberrations and disturb the imaging quality of the secondary charged particle beam.

To solve this problem, the optical element 180, e.g., a beam bender, and possibly further secondary optics downstream of the optical element 180 could be made into a movable arrangement whose position can be mechanically adjusted so that the secondary charged particle beam 120 would again be on-axis with respect to this movable arrangement. Alternatively, further alignment deflectors for the secondary charged particle beam could be provided to bring the secondary charged particle beam back on axis, i.e., align it with the target direction. But both solutions might imply a considerable hardware effort that is difficult and costly to implement due to its complexity and space limitations in the charged particle beam device.

Figure 4:
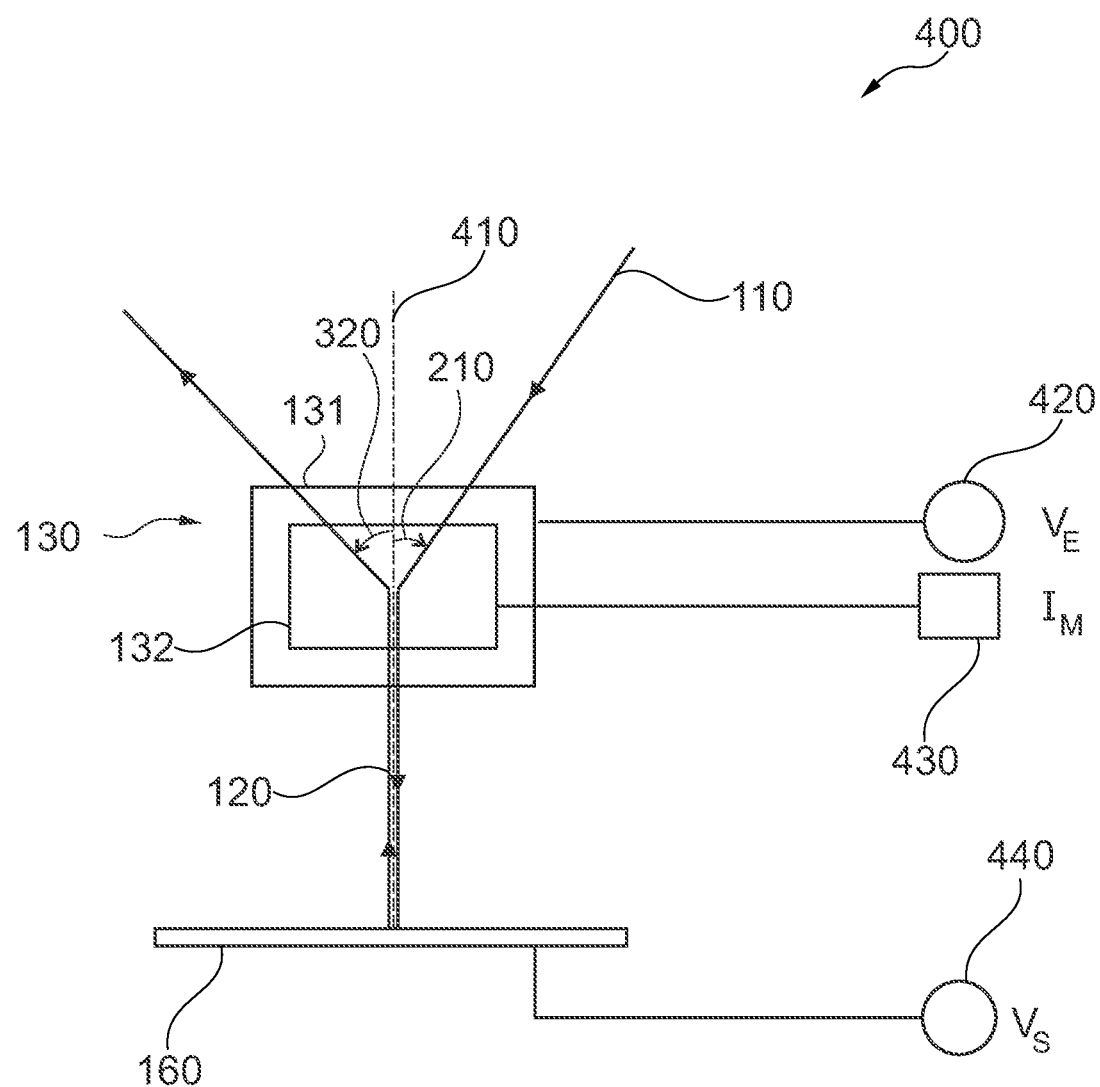
FIGS. 4-5 show a charged particle beam device including a beam separator according to embodiments described herein.
Figure 5:
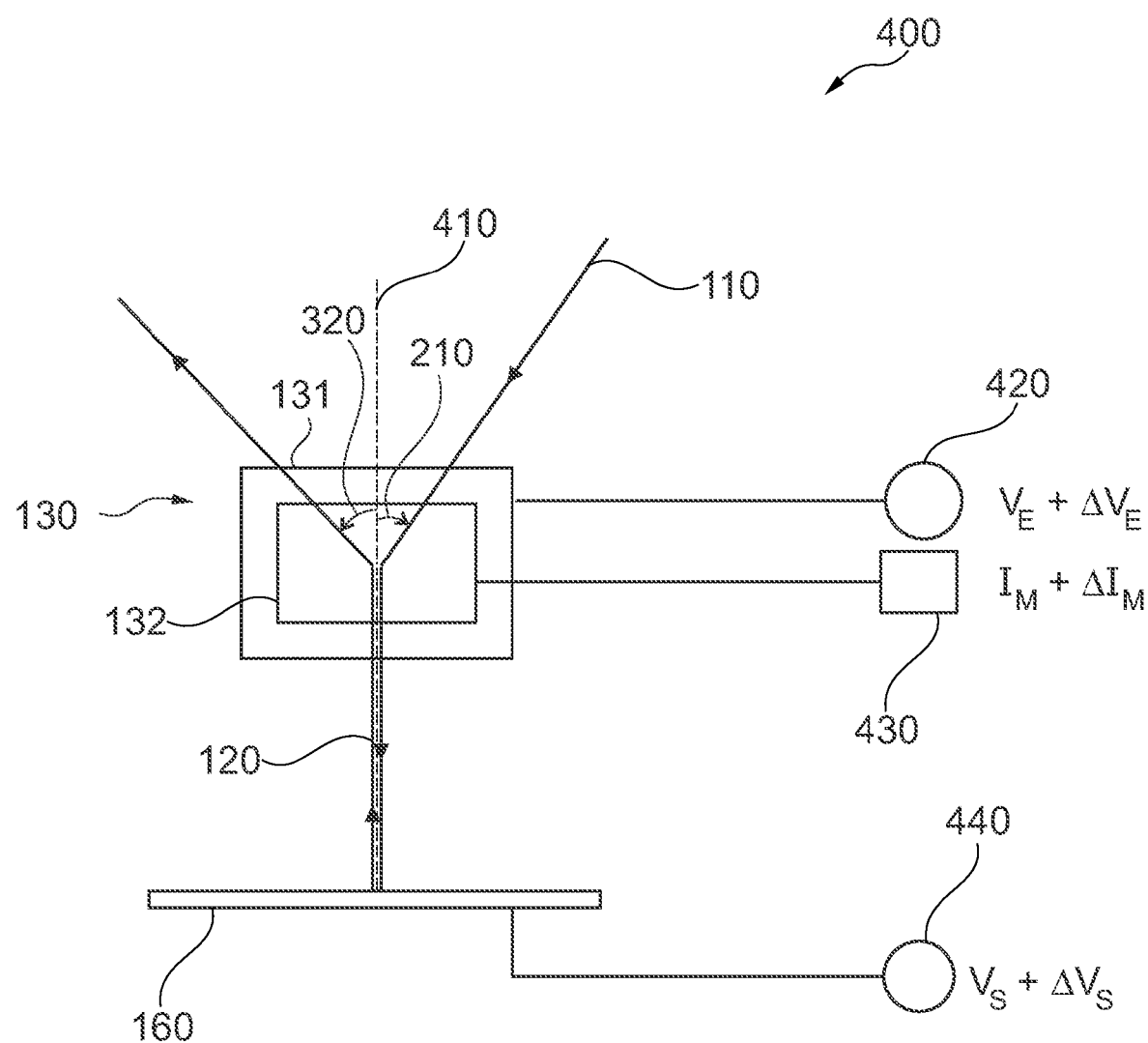

FIGS. 4 and 5 illustrate a charged particle beam device and method of operating the same according to embodiments described herein. FIG. 4 shows a charged particle device 400 including a beam separator 130. The beam separator 130 includes a magnetic beam separation portion 132 and an electrostatic beam separation portion 131. FIG. 4 further shows an electric current source 430 of the charged particle beam device 400. The electric current source 430 is adapted for creating an electric current in the magnetic beam separation portion 132. The electric current in the magnetic beam separation portion 132 may generate a magnetic field. The electric current may be created by applying a voltage to the magnetic beam separation portion. The magnetic beam separation portion 132 may include an electromagnet. The electric current may pass through a coil or winding of the electromagnet (not shown) included in the magnetic beam separation portion to generate the magnetic field. FIG. 4 further shows a voltage source 420 of the charged particle beam device 400. The voltage source 420 is adapted for applying a voltage to the electrostatic beam separation portion 131. The electrostatic beam separation portion may generate an electric field. The voltage may be applied to electrodes (not shown), such as a pair of electrodes, included in the electrostatic beam separation portion. The electric field may be generated between the electrodes.

As shown in FIG. 4, the electric current is set to a first value $I_M$ by the electric current source 430. A first magnetic field is created by the magnetic beam separation portion 132 when the electric current is set to the first value N. The voltage applied by the voltage source 420 is set to a first value $V_E$. A first electric field is created by the electrostatic beam separation portion 131 when the voltage is set to the first value $V_E$.

The primary charged particle beam 110 shown in FIG. 4 enters the beam separator 130 at the first angle 210 which, in the exemplary embodiment shown, is a positive angle relative to the optical axis 410. The primary charged particle beam 110 is subsequently deflected in the beam separator 130, wherein the primary charged particle beam 110 leaving the beam separator 130 is parallel to the optical axis 410.

The deflection of the primary charged particle beam 110 occurs under the influence of the first electric field and the first magnetic field. Accordingly, the total deflection includes an electrostatic deflection and a magnetic deflection.

The first electric field generates an electric force. The electric force acts on the primary charged particle beam traveling through the beam separator portion, thereby resulting in the electrostatic deflection of the charged particle beam in the beam separator. The electrostatic deflection is proportional to the strength of the first electric field and inversely proportional to the energy of the primary charged particle beam passing through the beam separator.

The first magnetic field generates a magnetic force. The magnetic force acts on the primary charged particle beam traveling through the beam separator, thereby resulting in the magnetic deflection of the primary charged particle beam. The magnetic deflection is proportional to the strength of the first magnetic field and inversely proportional to the square root of the energy of the primary charged particle beam passing through the beam separator.

In view of the above, the deflection of the primary charged particle beam in the beam separator shown in FIG. 4 is determined by the energy of the primary charged particle beam and the values of the first electric field and of the first magnetic field, wherein the first electric field is determined by the first value $V_E$ of the voltage applied by the voltage source 420, and the first magnetic field is determined by the first value of the current $I_M$ generated by the electric current source 430. In particular, the second angle 220 of the primary charged particle beam leaving the beam separator 130 relative to the optical axis 410 (see FIG. 2), which is equal to zero in the embodiment shown in FIG. 4, is determined by the energy of the primary charged particle beam, by the first electric field and by the first magnetic field.

The charged particle beam device 400 further includes a sample voltage source 440. The sample voltage source 440 is configured for applying a sample voltage to the sample 160 to adjust a landing energy of the primary charged particle beam 110 on the sample 160. As used herein, the term "landing energy" may refer to the energy, e.g. the main energy or average energy, of the primary charged particle beam upon impinging onto the sample. The value of the sample voltage affects the strength of an electric force accelerating or decelerating the primary charged particles with respect to the sample. Accordingly, adjusting the value of the sample voltage allows adjusting the landing energy of the primary charged particle beam.

As indicated in FIG. 4, the sample voltage is set to a first value $V_S$ to determine a first landing energy of the primary charged particle beam. After impingement of the primary charged particle beam on the sample 160, to which the sample voltage with the first value $V_S$ is applied, the secondary charged particle beam 120 is generated. The energy of the secondary charged particle beam 120 is affected by the landing energy of the primary charged particle beam 110.

The secondary charged particle beam 120 travels from the sample 160 to the beam separator 130 wherein, in the exemplary embodiment shown, the secondary charged particle beam 120 travels along the optical axis 410 before entering the beam separator 130. The secondary charged particle beam 120 is subsequently deflected in the beam separator 130, wherein the secondary charged particle beam 120 leaves the beam separator 130 at the fourth angle 320. The fourth angle 320 shown in FIG. 4 is a negative angle. The secondary charged particle beam 120 is deflected away from the primary charged particle beam 110 in the beam separator 130.

The deflection of the secondary charged particle beam in the beam separator occurs under the influence of the first electric field and the first magnetic field. The deflection thus includes an electrostatic deflection and a magnetic deflection. The electric force generated by the first electric field acts on the secondary charged particle beam traveling through the electric beam separation portion, resulting in the electrostatic deflection of the secondary charged particle beam in the beam separator. The electrostatic deflection is proportional to the strength of the first electric field and inversely proportional to the energy of the secondary charged particle beam passing through the beam separator. A magnetic force generated by the first magnetic field acts on the secondary charged particle beam traveling through the magnetic beam separation portion, resulting in the magnetic deflection of the secondary charged particle beam. The magnetic deflection is proportional to the strength of the first magnetic field and inversely proportional to the square root of the energy of the secondary charged particle beam passing through the beam separator.

In view of the above, the deflection of the secondary charged particle beam 120 in the beam separator 130 is determined by the energy of the secondary charged particle beam and the values of the first electric field and the first magnetic field. In particular, the fourth angle 320 is determined by the energy of the secondary charged particle beam and the first values of the first electric field and the first magnetic field. The energy of the secondary charged particle beam, in turn, depends on the landing energy of the primary charged particle beam. The energy of the secondary charged particle beam may also depend on an acceleration voltage which can be applied, for instance, in electrostatic immersion optics. Thus, an acceleration voltage may be applied to accelerate the secondary charged particles leaving the sample.

FIG. 5 shows the charged particle beam device 400 of FIG. 4 in a different state of operation. In FIG. 5, the value of the sample voltage has been changed to probe the sample 160 with a different landing energy of the primary charged particle beam 110. As indicated in FIG. 5, the sample voltage is set to a second value $V_S+\Delta V_S$ which is different from the first value $V_S$. Thereby, a second landing energy of the primary charged particle beam 110 is determined. After impingement of the primary charged particle beam 110 on the sample 160 to which the sample voltage with the second value $V_S+\Delta V_S$ is applied, the secondary charged particle beam 120 is generated. The energy of the secondary charged particle beam 120 is affected by the second landing energy of the primary charged particle beam 110. Accordingly, the energy of the secondary charged particle beam 120 shown in FIG. 5 may be different compared to the embodiment shown in FIG. 4. As explained above, this would lead to the secondary charged particle beam 120 being off-axis with respect to a target direction after leaving the beam separator 130.

To compensate this undesired effect, as further shown in FIG. 5, the electric current created by the electric current source 430 in the magnetic beam separation portion 132 is set to a second value $I_M+\Delta I_M$ to generate a second magnetic field. As further shown, the voltage applied to the electrostatic beam separation portion 131 by the voltage source 420 is set to a second value $V_E+\Delta V_E$ to generate a second electric field. The second value $I_M+\Delta I_M$ of the electric current may different from the first value $I_M$ and/or the second value $V_E+\Delta V_E$ of the voltage may be different from the first value $V_E$. At least one of the second value of the electric current and the second value of the voltage is different from the respective first values. Accordingly, the second magnetic field is different from the first magnetic field and/or the second electric field is different from the first electric field.

The deflection of the primary charged particle beam 110 in the beam separator 130 shown in FIG. 5 occurs under the influence of the second electric field and the second magnetic field. The deflection includes an electrostatic deflection and a magnetic deflection. The electrostatic deflection is proportional to the strength of the second electric field and inversely proportional to the energy of the primary charged particle beam passing through the beam separator, wherein the energy of the primary charged particle beam may be the same as the energy of the primary charged particle beam shown in FIG. 4. The magnetic deflection is proportional to the strength of the second magnetic field and inversely proportional to the square root of the energy of the primary charged particle beam passing through the beam separator. Accordingly, the deflection of the primary charged particle beam is determined by the energy of the primary charged particle beam and the values of the second electric field and the second magnetic field.

The deflection of the secondary charged particle beam in the beam separator shown in FIG. 5 occurs under the influence of the second electric field and the second magnetic field. The deflection includes an electrostatic deflection and a magnetic deflection. The electrostatic deflection is proportional to the strength of the second electric field and inversely proportional to the energy of the secondary charged particle beam passing through the beam separator. The energy of the secondary charged particle beam 120 shown in FIG. 5, is affected by the second landing energy of the primary charged particle beam 110, and is different from the energy of the secondary charged particle beam 120 shown in FIG. 4. The magnetic deflection is proportional to the strength of the second magnetic field and inversely proportional to the square root of the energy of the secondary charged particle beam passing through the beam separator. Accordingly, the deflection of the secondary charged particle beam in the beam separator is determined by the energy of the secondary charged particle beam and the values of the second electric and second magnetic fields.

The second value $I_M+\Delta I_M$ of the electric current in the magnetic beam separation portion 132 generating the second magnetic field, and the second value $V_E+\Delta V_E$ of the voltage applied to the electrostatic beam separation portion 131 generating the second electric field are calculated and chosen so that the deflection of the primary charged particle beam 110 and the deflection of the secondary charged particle beam 120 by the beam separator 130 remain the same as under the operating conditions of FIG. 4. In other words, the first angle 310, the fourth angle 320, and the parallel directions of the primary charged particle beam 110 after the beam separator 130 and of the secondary charged particle beam 120 before the beam separator 130, both parallel to the optical axis 410, remain constant. More generally, the second angle 220 and the third angle 310 as shown in FIGS. 2 and 3 together with the first angle 310 and the fourth angle 320 can be kept constant independently of a variation of the landing energy of the primary charged particle beam. The secondary charged particle beam 120 is still aligned to a target direction when leaving the beam separator 130 even though the sample voltage has been varied and the landing energy of the primary charged particle beam and the energy of the secondary charged particle beam have changed accordingly.

The beam separator, being adapted to generate both an electric and a magnetic field, has two degrees of freedom to influence the deflection angles of the primary and secondary charged particle beams. By suitably adjusting the electric current of the magnetic beam separation portion and the voltage applied to the electrostatic beam separation portion, the two degrees of freedom may be used to adjust the deflection angles of the primary charged particle beam and of the secondary charged particle beam. The deflection angles of the primary and secondary charged particle beams may thus be adjusted to predetermined target values, independently of the landing energy of the primary charged particle beam.

The charged particle beam device and method of operating thereof according to these embodiments provides the advantage that the sample may be efficiently imaged in different imaging modes using different landing energies of the primary charged particle. The deflection angle of the secondary charged particle beam can be adjusted so that it is equal to a target value, wherein the target value may be determined by the spatial arrangement of the charged particle device, as described above. This has the advantage that the secondary charged particle beam may always be made to travel along a target axis. No or little additional effort may be needed to align the secondary charged particle beam with the target axis. In particular, no additional beam shaping elements such as alignment deflectors or mechanical arrangements that move parts of the charged particle beam device are necessary. This allows a fast adaptation to different imaging and operating conditions, e.g., to resolve structures of different sizes or depths on the sample, and yields a high throughput. Additionally or alternatively, the design of detection optics and/or a detector sensor may be facilitated. Alignment deflectors might still be used to compensate for mechanical imperfections and/or static misalignment of optical elements included in the charged particle beam device.

Further, while FIGS. 4 and 5 exemplarily showed the primary charged particle beam to impinge substantially perpendicularly to the surface of the sample, the primary charged particle beam may also be tilted. By the adjustable deflection angle for the primary charged particle beam the sample may be inspected from different directions in a tilted mode. This may provide additional information about the sample surface compared to the case where the sample is inspected from a single direction such as perpendicularly from above.

Embodiments described herein thus allow inspecting and/or structuring the sample at varying landing energies, and, if desired, at varying inclination angles of the primary charged particle beam onto the surface of the sample, wherein the deflection angles of the primary and secondary charged particle beams in the beam separator may be adapted such that the secondary charged particle beam can exit from the beam separator with a constant target direction or on a target axis, and pass through optical element(s) downstream of the beam separator in a well-aligned way.

Further embodiments described herein relate to a method of operating a charged particle beam device. The charged particle beam device may be the charged particle beam device 400 shown in FIGS. 4-5. The method described may be performed by the charged particle beam device 400 and the components thereof, namely the beam separator 130 with the electrostatic beam separation portion 131 and the magnetic beam separation portion 132, coupled to the voltage source 420 and the electric current source 430, respectively, and the sample voltage source 440 for applying a varying sample voltage to a sample, as described with respect to FIGS. 4-5, but may alternatively be performed by a different charged particle beam device.

The charged particle beam device includes a beam separator. The beam separator may define an optical axis. The optical axis may be a symmetry axis of the beam separator. The charged particle beam device may include an objective lens. The optical axis may alternatively be defined by the objective lens. The beam separator and the objective lens may each define an optical axis, and the optical axis of the beam separator may be parallel to, or coincide with, the optical axis of the objective lens. The beam separator includes a magnetic beam separation portion and an electrostatic beam separation portion.

Figure 8:
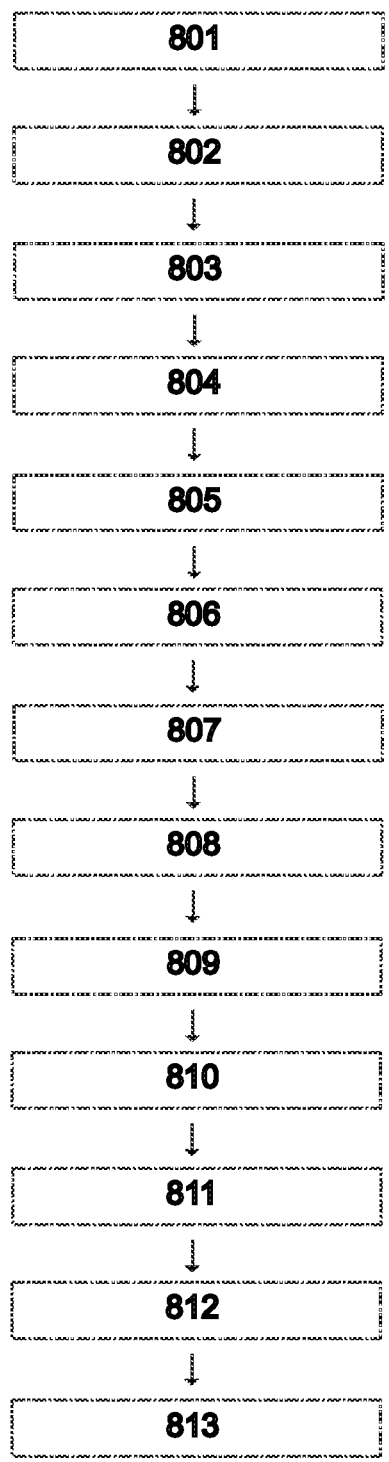
FIGS. 8-9 show flow diagrams of methods of operating a charged particle beam device according to embodiments described herein.

The method includes generating a primary charged particle beam, as indicated in FIG. 8 by reference sign 801. The method further includes applying a sample voltage to a sample, as indicated in FIG. 8 by reference sign 802. The sample voltage applied to the sample may be an adjustable voltage. The sample voltage may be applied to the sample by a sample voltage source.

The sample voltage applied to the sample is set to a first value, such as the value $V_S$ shown in FIG. 4, to determine a first landing energy of the primary charged particle beam. The first landing energy of the primary charged particle beam may be an adjustable first landing energy. According to some embodiments, which can be combined with other embodiments described herein, the method includes selecting the first value of the sample voltage applied to the sample from a set of values.

The method further includes creating an electric current in the magnetic beam separation portion, as indicated in FIG. 8 by reference sign 803. The electric current may be created by an electric current source. The electric current may be guided through a coil or coil assembly included in the magnetic beam separation portion. The optical axis may be a symmetry axis of the coil or coil assembly. The electric current created in the magnetic beam separation portion is set to a first value, such as the value $I_M$ shown in FIG. 4, to generate a first magnetic field. The first magnetic field may be determined by the first value of the electric current. The electric current may be adjustable, and the magnetic field may also be adjustable. The magnetic field may be adjusted by adjusting the value of the electric current.

The method further includes applying a voltage to the electrostatic beam separation portion, as indicated in FIG. 8 by reference sign 804. The voltage may be applied by a voltage source. The voltage may be applied to electrodes forming part of the electrostatic beam separation portion. The electrodes may include an assembly of electrodes, e.g. an assembly of two electrodes. The optical axis may be a symmetry axis of the assembly of electrodes. The voltage applied to the electrostatic beam separation portion is set to a first value, such as the value $V_E$ shown in FIG. 4, to generate a first electric field. The first electric field may be determined by the first value of the voltage applied to the electrostatic beam separation portion. The voltage applied to the electrostatic beam separation portion may be adjustable, and the electric field may be an adjustable electric field. The electric field may be adjusted by adjusting the voltage applied to the electrostatic beam separation portion.

The method further includes guiding the primary charged particle beam to the beam separator, as indicated in FIG. 8 by reference sign 805. The primary charged particle beam enters the beam separator at a first angle relative to the optical axis, such as e.g. the first angle 210 shown in FIG. 2, and, under the influence of the first magnetic field and the first electric field, leaves the beam separator at a second angle relative to the optical axis, such as the second angle 220 shown in FIG. 2.

The primary charged particle beam may travel through the beam separator. The primary charged particle beam may enter and leave the beam separator at different sides of the beam separator, more specifically at opposite sides of the beam separator. The first angle may be different from the second angle, in which case the primary charged particle beam is deflected in the beam separator. In some embodiments, the first angle is equal to the second angle, in which case the primary charged particle beam passes through the beam separator without changing its direction. The sample may be disposed on the side of the beam separator at which the primary charged particle beam leaves the beam separator.

The influence of the first electric field on the primary charged particle beam may include an electrostatic deflection of the primary charged particle beam, more specifically an electrostatic deflection in one spatial dimension or an electrostatic deflection in two spatial dimensions. The influence of the first magnetic field on the primary charged particle beam may include a magnetic deflection of the primary charged particle beam, more specifically a magnetic deflection in one spatial dimension or a magnetic deflection in two spatial dimensions.

The method further includes generating a secondary charged particle beam by impingement of the primary charged particle beam on the sample to which the sample voltage with the first value is applied, as indicated in FIG. 8 by reference sign 806. The primary charged particle beam may impinge on the sample at the first landing energy.

The secondary charged particle beam may leave the sample at the side, or from the surface, of the sample at which the primary charged particle beam impinges on the sample. The secondary charged particle beam may travel away from the sample in a direction which is opposite or substantially opposite to the direction in which the primary charged particle travels directly before impinging onto the sample.

The method further includes separating the secondary charged particle beam from the primary charged particle beam in the beam separator, as indicated in FIG. 8 by reference sign 807. The secondary charged particle beam enters the beam separator at a third angle relative to the optical axis, such as the third angle 310 shown in FIG. 3, and, under the influence of the first magnetic field and the first electric field, leaves the beam separator at a fourth angle relative to the optical axis, such as the fourth angle 320 shown in FIG. 3. The first angle and the fourth angle are different.

The influence of the first electric field on the secondary charged particle beam may include an electrostatic deflection of the secondary charged particle beam, more specifically an electrostatic deflection in one spatial dimension or an electrostatic deflection in two spatial dimensions. The influence of the first magnetic field on the secondary charged particle beam may include a magnetic deflection of the secondary charged particle beam, more specifically a magnetic deflection in one spatial dimension or a magnetic deflection in two spatial dimensions.

The secondary charged particle beam may travel through the beam separator. The secondary charged particle beam may enter and leave the beam separator at different sides of the beam separator, more specifically at opposite sides of the beam separator. The sample may be disposed on the side of the beam separator at which the secondary charged particle beam enters the beam separator. The primary and secondary charged particle beams may enter the beam separator at different sides of the beam separator. More specifically the primary charged particle beam and the secondary charged particle beam may enter the beam separator from opposite sides of the beam separator.

Separating the secondary charged particle beam from the primary charged particle beam may include directing the secondary charged particle beam leaving the beam separator away from a path along which the primary charged particle beam travels before entering into the beam separator.

The fourth angle, being the angle at which the secondary charged particle beam leaves the beam separator, may be different from the third angle. The secondary charged particle beam may change the direction of propagation in the beam separator, i.e., the secondary charged particle beam may be deflected in the beam separator.

According to some embodiments, which can be combined with other embodiments described herein, the first value of the electric current created in the magnetic beam separation portion and/or the first value of the voltage applied to the electrostatic beam separation portion depend on the first value of the voltage applied to the sample and/or depend on the first landing energy.

The first value of the electric current created in the magnetic beam separation portion and/or the first value of the voltage applied to the electrostatic beam separation portion may be calculated values. The calculated values of the voltage and/or electric current may be calculated from at least one of the following: a target value for the second angle; a target value for the fourth angle; the first value of the voltage applied to the sample; the first landing energy. The electric current with the calculated first value may be created in the magnetic beam separation portion to generate the first magnetic field. The voltage with the calculated first value may be applied to the electrostatic beam separation portion to generate the first electric field. The primary charged particle beam, under influence of the first magnetic and the first electric field, may leave the beam separator at the second angle, wherein the second angle is equal to the target value for the second angle. The secondary charged particle beam, under the influence of the first magnetic and first electric field, may leave the beam separator at the fourth angle, wherein the fourth angle is equal to the target value for the fourth angle.

The target value for the second angle and the target value for the fourth angle may be independent of the voltage applied to the sample and/or of a landing energy of the primary charged particle beam, such as the first landing energy.

The target value for the second angle may be a variable target value. The target value may be selectable from a set of multiple target values. The target value for the second angle may relate to, or determine, a target inclination angle of the primary charged particle beam impinging on the sample. Varying the target value of the second angle may allow varying the target inclination angle, in particular if the configuration of the charged particle device is such that the primary charged particle beam traveling away from the beam separator does not change its direction until impinging onto the sample. For example, the primary charged particle beam shown in FIG. 4 travels from the beam separator to the sample along a straight line, so that the inclination angle of the primary charged particle beam is determined by the second angle, which is zero degrees relative to the optical axis 410 in FIG. 4, meaning an impingement perpendicular to the surface of the sample that is to be inspected or structured.

An advantage of having a variable inclination angle is that the sample may be analyzed from different directions. This may provide more information about the sample surface compared to e.g. a case where the sample is inspected from a single direction. For instance, structures such as trenches in the sample surface with vertical walls may be nearly invisible when viewed directly from above, but can be revealed by observation with a tilted primary charged particle beam.

The target value for the fourth angle may be a constant value. The target value for the fourth angle may be determined by the hardware arrangement of the charged particle beam device. In particular, the target value for the fourth angle may be determined by the optical element that is next in the path of the secondary charged particle beam after the secondary charged particle beam has left the beam separator, i.e., the optical element directly downstream of the beam separator along the path of the secondary charged particle beam. The method may include guiding the secondary charged particle beam from the beam separator to an optical element, such as e.g. optical element 180 shown in FIG. 1. The optical element may be a beam bender, e.g., a hemispherical sector, or may be part of the secondary charged particle beam optics, e.g., a lens or an aperture. The optical element may be disposed in the charged particle beam device at a fixed position relative to the beam separator. The target value of the fourth angle may be determined by the position of the optical element relative to the beam separator. A target axis may be defined, such as e.g. target axis 181 shown in FIG. 1, along which the secondary charged particle beam is to travel from the beam separator to the optical element. The target axis may be defined by the optical element. The target value for the fourth angle may relate to, depend on, and/or be determined by the angle between the target axis and the optical axis.

The method further includes applying the sample voltage to the sample, as indicated in FIG. 8 by reference sign 808. The voltage is set a second value, such as e.g. the value $V_S + \Delta V_S$ shown in FIG. 5, to determine a second landing energy of the primary charged particle beam. The second value of the sample voltage is different from the first value of the sample voltage. The second landing energy is different from the first landing energy. The second landing energy may be larger or smaller than the first landing energy. The landing energy of the primary charged particle beam may be adjustable, producing, e.g., a second landing energy, third landing energy, fourth landing energy etc. According to some embodiments, which can be combined with other embodiments described herein, the method includes selecting the second value of the sample voltage applied to the sample from a set of values.

The method further includes creating the electric current in the magnetic beam separation portion, as indicated in FIG. 8 by reference sign 809. The electric current is set to a second value, such as e.g. second value $I_M+\Delta I_M$ shown in FIG. 5, to generate a second magnetic field. The second magnetic field may be determined by the second value of the electric current. The magnetic field may be adjustable, producing, e.g., a second magnetic field, third magnetic field, fourth magnetic field etc. The magnetic field may be adjusted by adjusting the electric current generated in the magnetic beam separation portion. The method further includes applying the voltage to the electrostatic beam separation portion, as indicated in FIG. 8 by reference sign 810. The voltage is set to a second value, such as e.g. second value $V_E+\Delta V_E$ shown in FIG. 5, to generate a second electric field. The second electric field may be determined by the second value of the voltage applied to the electrostatic beam separation portion. The electric field may be adjustable, producing, e.g., a second electric field, third electric field, fourth electric field etc. The electric field may be adjusted by adjusting the voltage applied to the electrostatic beam separation portion.

The method further includes guiding the primary charged particle beam to the beam separator, as indicated in FIG. 8 by reference sign 811. The voltage with the second value may be applied to the electrostatic beam separation portion and/or the current with the second value may be created in the magnetic beam separation portion. The primary charged particle beam enters the beam separator at the first angle relative to the optical axis and, under the influence of the second magnetic field and the second electric field, leaves the beam separator at the second angle relative to the optical axis.

The influence of the second electric field on the primary charged particle beam may include an electrostatic deflection of the primary charged particle beam, more specifically an electrostatic deflection in one spatial dimension or an electrostatic deflection in two spatial dimensions. The influence of the second magnetic field on the primary charged particle beam may include a magnetic deflection of the primary charged particle beam, more specifically a magnetic deflection in one spatial dimension or a magnetic deflection in two spatial dimensions.

The method further includes generating the secondary charged particle beam by impingement of the primary charged particle beam on the sample to which the sample voltage with the second value is applied, as indicated in FIG. 8 by reference sign 812. The primary charged particle beam may impinge on the sample at the second landing energy.

The method further includes separating the secondary charged particle beam from the primary charged particle beam in the beam separator, as indicated in FIG. 8 by reference sign 813. The secondary charged particle beam enters the beam separator at the third angle relative to the optical axis and, under the influence of the second magnetic field and the second electric field, leaves the beam separator at the fourth angle relative to the optical axis.

The influence of the second electric field on the secondary charged particle beam may include an electrostatic deflection of the secondary charged particle beam, more specifically an electrostatic deflection in one spatial dimension or an electrostatic deflection in two spatial dimensions. The influence of the second magnetic field on the secondary charged particle beam may include a magnetic deflection of the secondary charged particle beam, more specifically a magnetic deflection in one spatial dimension or a magnetic deflection in two spatial dimensions.

According to some embodiments, which can be combined with other embodiments described herein, the second value of the voltage applied to the electrostatic beam separation portion and/or the second value of the electric current created in the magnetic beam separation portion depend on the second voltage applied to the sample and/or the second landing energy.

According to some embodiments, which can be combined with other embodiments described herein, the second value of the voltage applied to the electrostatic beam separation portion and/or the second value of the electric current created in the magnetic beam separation portion are calculated values. The calculated second values of the voltage and/or electric current may be calculated from at least one of the following: the target value for the second angle; the target value for the fourth angle; the second value of the voltage applied to the sample; the second landing energy. The electric current with the calculated second value may be created in the magnetic beam separation portion to generate the second magnetic field. The voltage with the calculated second value may be applied to the electrostatic beam separation portion to generate the second electric field. The primary charged particle beam, under influence of the second magnetic field and the second electric field, may leave the beam separator at the second angle, wherein the second angle is equal to the target value for the second angle. The secondary charged particle beam, under the influence of the second magnetic field and second electric field, may leave the beam separator at the fourth angle, wherein the fourth angle is equal to the target value for the fourth angle.

The first electric field, the second electric field, the first magnetic field and/or the second magnetic field may be perpendicular or substantially perpendicular to the optical axis. In addition or alternatively, the first electric field may be perpendicular or substantially perpendicular to the first magnetic field. Still in addition or alternatively, the second electric field may be perpendicular or substantially perpendicular to the second magnetic field.

The second electric field may be parallel or substantially parallel to the first electric field. The parallel first and second electric fields may be oriented in the same or opposite directions. Alternatively, the second electric field and the first electric field may be substantially non-parallel. The second magnetic field may be parallel or substantially parallel to the first magnetic field. The parallel first and second magnetic fields may be oriented in the same or opposite directions. Alternatively, the second magnetic field and the first magnetic field may be substantially non-parallel.

The first electric field, the second electric field, the first magnetic field and/or the second magnetic field may be generated by one or more dipole elements. Alternatively or in addition, the first electric field, the second electric field, the first magnetic field and/or the second magnetic field may be generated by one or more multi-pole elements. The one or more multipole elements may include one or more quadrupole elements and/or one or more octopolole elements.

According to some embodiments, which can be combined with other embodiments described herein, the difference between the first landing energy and the second landing energy may lie in the range between 0 and 10 keV, more specifically from 0.1 to 5 keV, still more specifically from 1 to 2 keV. The difference between the first value of the sample voltage and the second value of the sample voltage may be in the range between 0 and 10 kV, more specifically from 0.1 to 5 kV, still more specifically from 1 to 2 kV. The first value and/or the second value of the sample voltage may lie in the range from 0.05 to 10 kV, more specifically 0.1 to 5 kV, still more specifically 1 to 2 kV. The sample voltage is a relative quantity specified in relation to the potential of the beam column of the charged particle beam device. Accordingly, the values of the sample voltage are relative values. According to some embodiments, which can be combined with other embodiments described herein, the primary charged particle beam and the secondary charged particle beam are electron beams, and the first landing energy and the second landing energy lie in the range from 0.05 keV to 30 keV. Secondary electrons created at or in the sample start with energies in the range from 0 eV to 50 eV, while the value for backscattered electrons may be in the range from 50 eV to the landing energy, e.g., up to 30 keV. One may switch between a detection mode detecting mainly secondary electrons and a detection mode detecting mainly backscattered electrons.

According to some embodiments, which can be combined with other embodiments described herein, the third angle equals the second angle or is approximately the same as the second angle. The difference between the magnitude of the second angle and the magnitude of the third angle may lie in the range from 0 to 20 degrees, more specifically from 0 to 5 degrees. An axis along which the primary charged particle beam travels from the beam separator to the sample may overlap or coincide with an axis along which the secondary charged particle beam travels from the sample to the beam separator.

The primary charged particle beam may travel along the optical axis of the beam separator and/or along the optical axis of the objective lens upon leaving the beam separator. The secondary charged particle beam may travel along the optical axis of the beam separator and/or along the optical axis of the objective lens upon entering the beam separator.

According to some embodiments, which can be combined with other embodiments described herein, at least one of the following holds: (i) the magnitude of the first angle lies in the range from 0 to 20 degrees, more specifically in the range from 0 degrees to 15 degrees, still more specifically in the range from 0 to 10 degrees, e.g., 8 degrees (ii) the magnitude of the second angle lies in the range from 0 to 20 degrees, specifically from 0 to 12 degrees, (iii) the magnitude of the third angle lies in the range from 0 to 5 degrees, more specifically in the range from 0 to 2 degrees, and (iv) the magnitude of the fourth angle lies in the range from 0 to 30 degrees, specifically from 0 to 20 degrees.

Figure 6:
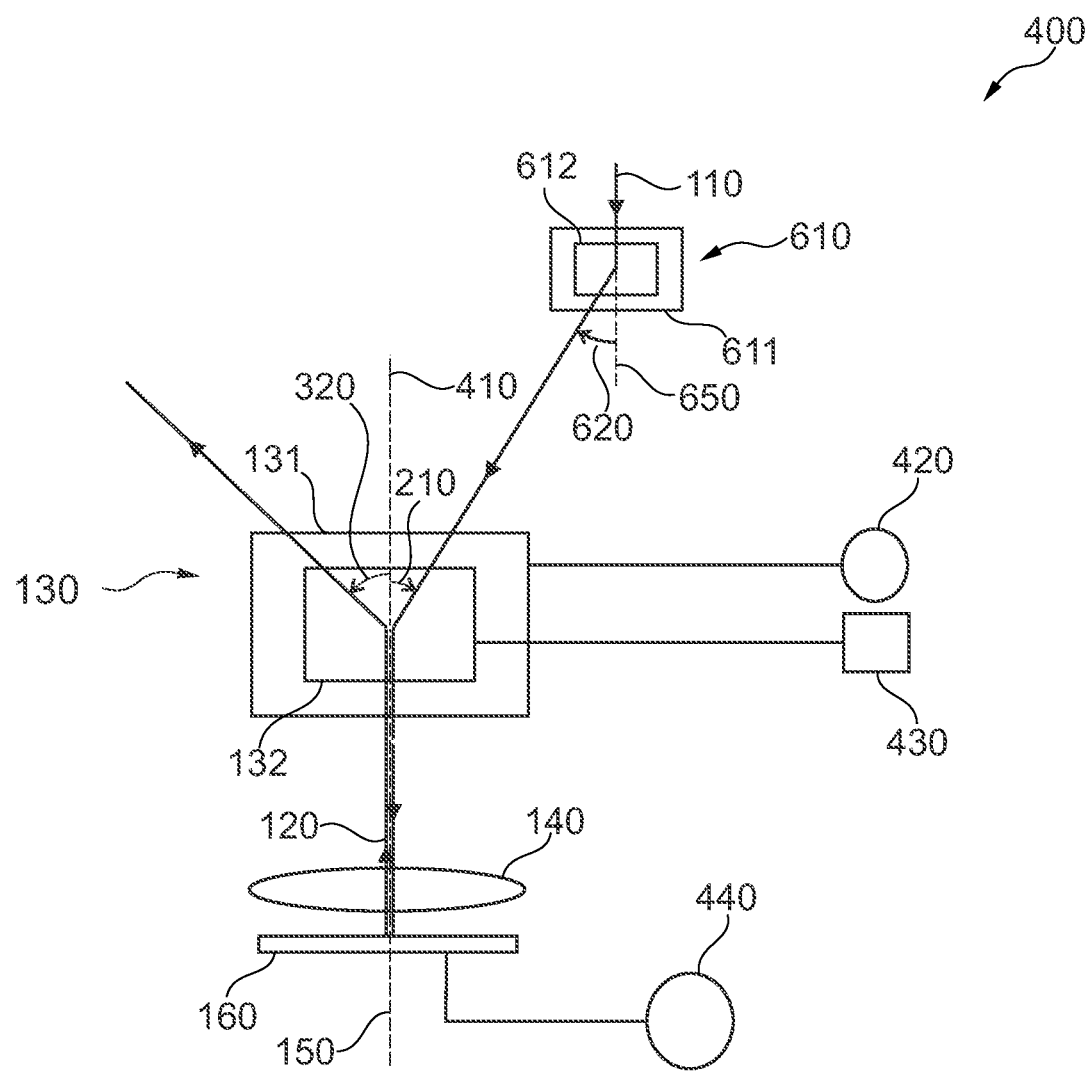
FIG. 6 shows a charged particle beam device including a dispersion compensation element according to embodiments described herein.

FIG. 6 illustrates an embodiment of a charged particle beam device including a dispersion compensation element 610. The dispersion compensation element 610 has an electrostatic dispersion compensation portion 611 and a magnetic dispersion compensation portion 612. The electrostatic dispersion compensation portion 611 may have a first dispersion characteristic. The magnetic dispersion compensation portion 612 may have a second dispersion characteristic. The first and second dispersion characteristic may be different. The electrostatic dispersion compensation portion 611 is adapted to generate an electric dispersion compensation field. The magnetic dispersion compensation portion 612 may be adapted to generate a magnetic dispersion compensation field. The electric dispersion compensation field and/or the magnetic dispersion compensation field may be adapted to influence the primary charged particle beam, in particular by introducing a particular amount of dispersion to compensate a dispersion of the beam separator. The dispersion compensation element may deflect the primary charged particle beam.

In FIG. 6, the dispersion compensation element 610 is arranged upstream of the beam separator 130 in relation to the primary charged particle beam 110. As shown in FIG. 6, the primary charged particle beam 110 travels through the dispersion compensation element 610. The primary charged particle 110 beam entering the dispersion compensation element 610 travels along optical axis 650 defined by the dispersion compensation element 610. The optical axis 650 may be the axis along which the beam emitter of the primary charged particle beam emits the primary charged particle beam. The primary charged particle beam 110 is subsequently deflected in the dispersion compensation element 610. The primary charged particle beam 110 travels straight from the dispersion compensation element 610 to the beam separator 130, i.e. without changing its direction between the dispersion compensation element 610 and the beam separator 130. The deflection of the primary charged particle beam 110 in the dispersion compensation element 610 is such that the primary charged particle beam 110 enters the beam separator 130 at the first angle 210 relative to optical axis 410. Specifically, the primary charged particle beam 110 is deflected in the dispersion compensation element 610 at a deflection angle 620 relative to optical axis 650, wherein the magnitude of the deflection angle 620 is equal to the magnitude of the first angle 210. In this way, the primary charged particle beam 110 propagates along parallel optical axes 610 and 410, except in the region between the dispersion compensation element 610 and the beam separator 130. The optical axis 410 is offset from the optical axis 610.

An advantage of deflecting the primary charged particle beam in the dispersion compensation element is that the geometric layout of the primary charged particle beam column can be designed more flexibly. An offset between an optical axis in an upper part of the primary charged particle beam column and an optical axis in a lower part of the primary charged particle beam column can give more space for secondary charged particle beam elements, such as a beam bender and/or secondary charged particle beam optics.

The beam separator 130 shown in FIG. 6 may introduce dispersion in the primary charged particle beam. Dispersion may result from deflection angles at which the primary charged particles are deflected in the beam separator being dependent on the individual energies or momenta of the primary charged particles. The dispersion compensation element 610 shown in FIG. 6 may have an adjustable dispersion to compensate the dispersion introduced by the beam separator 130. An advantage of compensating the dispersion introduced by the beam separator is that small charged particle probes with high current density may thus be generated.

Further, the dispersion compensation element 610 may be adapted for adjusting the dispersion independently of the deflection angle 620. In other words, the dispersion compensation element 610 may be adapted for adjusting the dispersion that the dispersion compensation element 610 introduces without substantially affecting the deflection angle 620. The dispersion compensation element 610 may be adapted for adjusting the dispersion independently of the entire path of the primary beam from the beam emitter (not shown) to the sample, i.e., the dispersion compensation element may act in a dispersive manner without significantly affecting the entire primary charged particle beam path.

As shown in FIG. 6, the optical axis 650 of the dispersion compensation element 610 is parallel to the optical axis 410 defined by the beam separator. Optical axis 650 is disposed at an off-set with respect optical axis 410. The secondary charged particles do not reach the dispersion compensation element 610, in other words the dispersion compensation element is arranged outside a secondary charged particle beam path of the charged particle beam device, such that it influences only the primary charged particle beam but not directly the secondary charged particle beam. In the exemplary embodiment shown, the dispersion compensation element 610 is disposed in the drawing plane on the right hand side of optical axis 410, whereas the entire path of the secondary charged particle travelling away from the beam separator lies on the left hand side of optical axis 410.

The charged particle device shown in FIG. 6 further includes objective lens 140. As indicated, the optical axis 150 defined by the objective lens coincides with the optical axis 410 defined by the beam separator.

In the embodiment illustrated in FIG. 6, the voltage sources 420 and 440 and the electric current source 430 may be set to their first values $V_S$, $V_E$ and $I_M$, respectively, as in FIG. 4. Alternatively or in addition, the voltage sources 420 and 440 and the electric current source 430 may be set to their second values $V_S + \Delta V_S$, $V_E + \Delta V_E$ and $I_M + \Delta I_M$, respectively, as in FIG. 5. In both cases, the primary charged particle beam and the secondary charged particle beam leave the beam separator 130 at the second angle and at the fourth angle, respectively. In the exemplary embodiment shown, the second angle is zero.

According to some embodiments, which can be combined with other embodiments described herein, the charged particle beam device includes a dispersion compensation element, such as e.g. dispersion compensation element 610 shown in FIG. 6. The dispersion compensation element may be arranged upstream of the beam separator in relation to the primary charged particle beam. The method described herein may further include compensating, by the dispersion compensation element, a dispersion which the beam separator introduces into the primary charged particle beam.

The dispersion introduced by the beam separator may be compensated by adjusting a dispersion of the dispersion compensation element. The dispersion introduced by the beam separator may be compensated to reduce a first-order chromatic aberration and/or a mean beam width of the primary charged particle beam. The dispersion of the beam separator may be compensated in the dispersion compensation element by adjusting a first dispersion of a magnetic dispersion compensation portion included in the dispersion compensation element and/or by adjusting a second dispersion of an electrostatic dispersion compensation portion included in the dispersion compensation element.

The method may further include deflecting the primary charged particle beam in the dispersion compensation element by a deflection angle. The deflection may include electrostatic deflection and/or magnetic deflection. The primary charged particle beam may be deflected in the dispersion compensation element by the electrostatic dispersion compensation portion and/or the magnetic dispersion compensation portion. According to some embodiments, which can be combined with other embodiments described herein, the dispersion introduced by the beam separator can be compensated independently of the deflection angle by which the primary charged particle beam is deflected in the dispersion compensation element.

According to some embodiments, which can be combined with other embodiments described herein, the magnitude of the deflection angle of the primary charged particle beam in the dispersion compensation element equals the magnitude of the first angle or is approximately equal to the magnitude of the first angle. According to some embodiments, the primary charged particle beam enters the dispersion compensation element parallel to the optical axis of the beam separator and the deflection angle of the primary charged particle beam in the dispersion compensation element is equal to the first angle.

According to some embodiments, which can be combined with other embodiments described herein, the primary charged particle beam passes through the dispersion compensation element without changing its direction. In other words, the deflection angle of the primary charged particle beam in the dispersion compensation is zero in this case.

According to some embodiments, which can be combined with other embodiments described herein, the optical axis of the beam separator coincides with an optical axis defined by an objective lens included in the charged particle beam device, such as e.g. objective lens 140 shown in FIG. 6.

Figure 7:
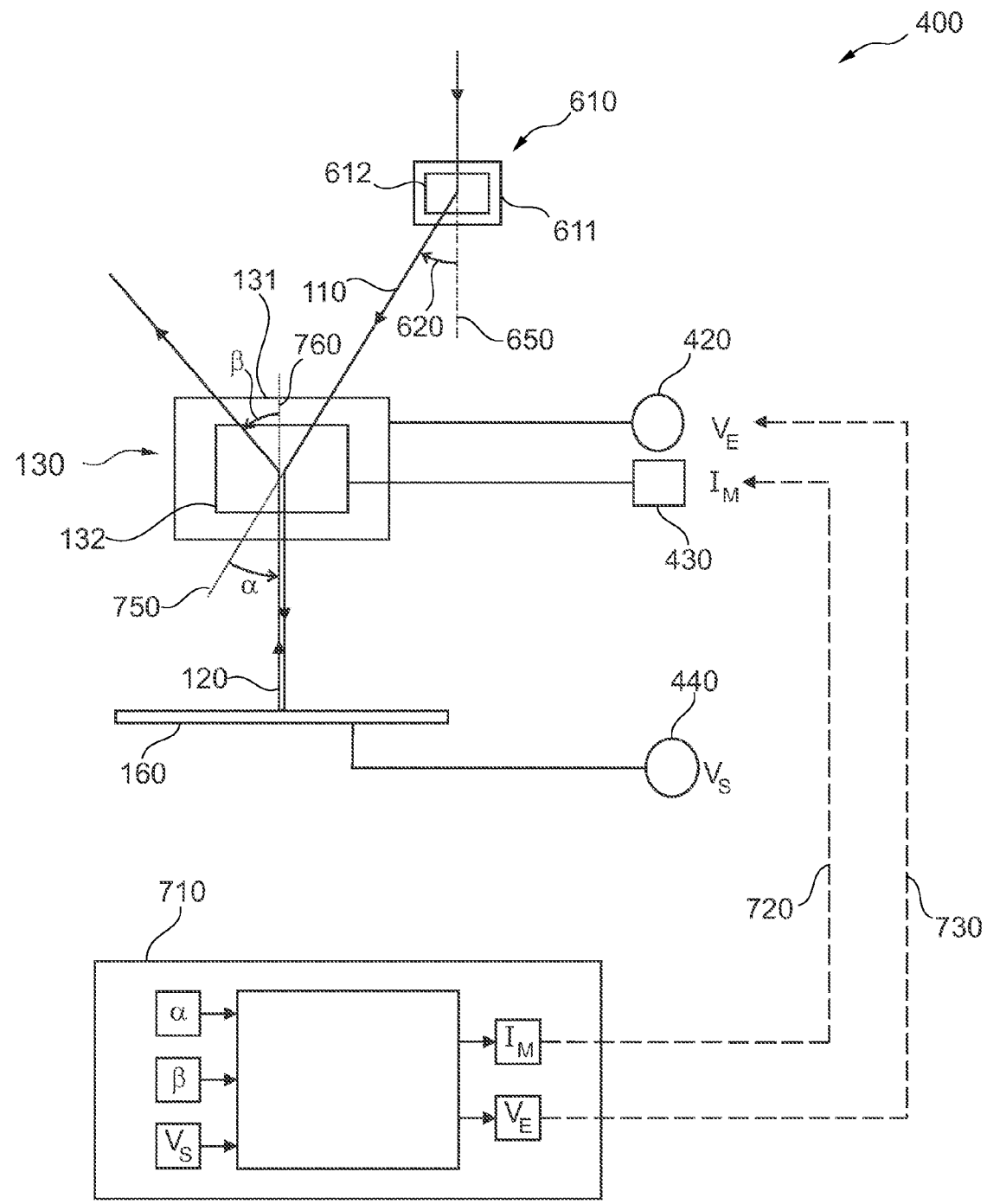
FIG. 7 shows a charged particle beam device including a processing unit according to embodiments described herein.

FIG. 7 illustrates an embodiment of charged particle device 400 including a processing unit 710. The processing unit is configured to calculate the first value $I_M$ of the electric current and the first voltage value $V_E$ from a primary reference angle α, a secondary reference angle β and the first value $V_S$ of the sample voltage. The primary reference angle corresponds to a target deflection of the primary charged particle beam in the beam separator, and the secondary reference angle corresponds to a target deflection of the secondary charged particle beam in the beam separator.

The primary reference angle may be a variable primary reference angle. Prior to being processed by the processing unit, the primary reference angle may have been selected from a set or range of primary reference angles. The primary reference angle may relate to, determine, or be determined by the target value of the second angle, as described above. The primary reference angle may relate to, or determine, the target inclination angle of the primary charged particle beam impinging on the sample. Varying the primary reference angle may allow varying the target inclination angle.

The secondary reference angle may be determined by the hardware arrangement of the charged particle beam device. The charged particle device may include an optical element (not shown), such as e.g. a beam bender, as described above. The secondary reference angle may be determined by the position of the optical element relative to the beam separator. The secondary reference angle may relate to, depend on, and/or be determined by a target axis along which the secondary charged particle beam is to travel from the beam separator to the optical element.

The primary and/or secondary reference angles may be independent of the first value $V_S$ of the voltage applied to the sample and/or of the first landing energy of the primary charged particle beam. Changing the value $V_S$ and/or the first landing energy may not influence the primary and/or secondary reference angles.

The primary reference angle α, the secondary reference angle β and the first value $V_S$ of the sample voltage may be input values or input variables of the processing unit. The processing unit may be configured to perform a calculation, wherein the calculation has the values α, β and $V_S$, and possibly other values, as its inputs. The first voltage value $V_E$ and the first value $I_M$ of the electric current are output values or output variables of the calculation. The first voltage value $V_E$ and the first electric current value $I_M$ may depend on the values α, β and $V_S$. Changing one or more of the values α, β and $V_S$ may lead to a different calculated value $V_E$ and/or a different calculated value N.

As indicated by arrow 720 in FIG. 7, the electric current with the calculated first value $I_M$ is created in the magnetic beam separation portion by the electric current source 430. Accordingly, the first magnetic field is generated. As further indicated by arrow 730, the voltage with the calculated first value $V_S$ is applied to the electrostatic beam separation portion by the voltage source 420. Accordingly, the first electric field is generated.

As further shown, the primary charged particle beam is deflected in the beam separator under influence of the first magnetic and the first electric field, wherein the deflection angle of the primary charged particle beam is equal to the primary reference angle. The deflection angle of the primary charged particle beam shown in FIG. 7 is the angle between the direction of propagation of the primary charged particle beam leaving the beam separator and the axis 750 along which the primary charged particle beam propagates prior to being deflected.

The secondary charged particle beam is also deflected in the beam separator under the influence of the first magnetic and first electric field. The deflection angle of the secondary charged particle beam is equal to the secondary reference angle. The deflection angle of the secondary charged particle beam shown in FIG. 7 is the angle between the direction of propagation of the secondary charged particle beam leaving the beam separator and the axis 760 along which the secondary charged particle beam propagates prior to being deflected.

In view of the above, the embodiment illustrated in FIG. 7 allows deflecting the primary and secondary charged particle beams in the beam separator at deflection angles that are independent of the landing energy of the primary charged particle beam on the sample.

Figure 9:
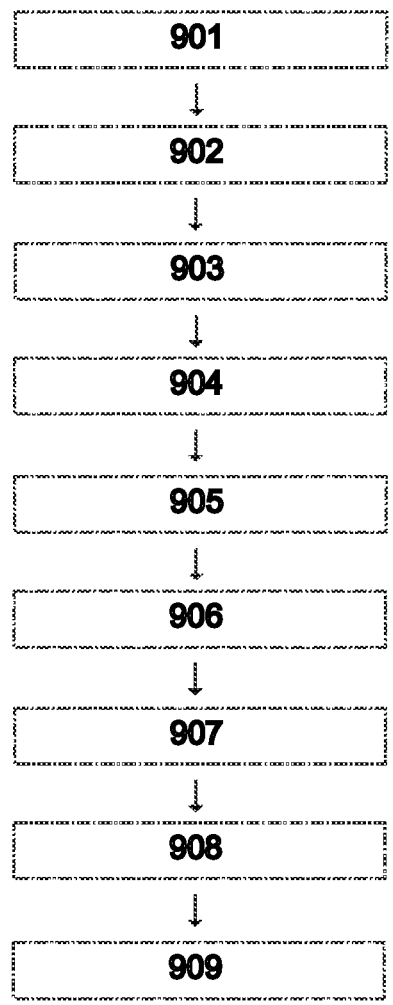

Embodiments described herein relate to a method of operating a charged particle beam device according to embodiments described herein, such as e.g. charged particle beam device 400 shown in FIG. 7. The method includes generating a primary charged particle beam, as indicated in FIG. 9 by reference sign 901. The method further includes applying a sample voltage to a sample, as indicated in FIG. 9 by reference sign 902. The sample voltage is set to a selected sample voltage value, such as e.g. first value $V_S$ shown in FIG. 7, to determine the landing energy of the primary charged particle beam, such as e.g. the first landing energy of the primary charged particle beam shown in FIG. 7.

The method further includes calculating a first electric current value, as indicated in FIG. 9 by reference sign 903. The first electric current value may as e.g. be the first electric current value $I_M$ shown in FIG. 7. The first electric current value may be calculated from a primary reference angle, such as e.g. primary reference angle α shown in FIG. 7, from a secondary reference angle, such as e.g. secondary reference angle β shown in FIG. 7, and from the sample voltage value, such as e.g. first value $V_S$ shown in FIG. 7. The primary reference angle corresponds to a target deflection of the primary charged particle beam in the beam separator and the secondary reference angle corresponds to a target deflection of a secondary charged particle beam in the beam separator. The method further includes creating an electric current in the magnetic beam separation portion, as indicated in FIG. 9 by reference sign 904. The electric current is set to the calculated first electric current value to generate a first magnetic field.

The method further includes calculating a first voltage value, as indicated in FIG. 9 by reference sign 905. The first voltage value may e.g. be the first voltage value $V_E$ shown in FIG. 7. The first voltage value may be calculated from the primary reference angle, the secondary reference angle and the sample voltage. The method further includes applying a voltage to the electrostatic beam separation portion, as indicated in FIG. 9 by reference sign 906. The voltage is set to the calculated first voltage value to generate a first electric field.

The method further includes guiding the primary charged particle beam through the beam separator, as indicated in FIG. 9 by reference sign 907. The primary charged particle beam is deflected in the beam separator under the influence of the first magnetic field and the first electric field. The primary charged particle beam is deflected by the primary reference angle.

The method further includes generating the secondary charged particle beam by impingement of the primary charged particle beam on the sample, as indicated in FIG. 9 by reference sign 908. The method further includes separating the secondary charged particle beam from the primary charged particle beam in the beam separator, as indicated in FIG. 9 by reference sign 909. The secondary charged particle beam is deflected in the beam separator under the influence of the first magnetic field and the first electric field, and wherein the secondary charged particle is deflected by the secondary reference angle.

According to some embodiments, which can be combined with other embodiments described herein, the angle between the primary charged particle beam entering the beam separator and the secondary charged particle beam leaving the beam separator lies in the range from 5 to 30 degrees. For example, in the embodiment illustrated in FIG. 7, the angle between primary charged particle beam 110 entering beam separator 130 and secondary charged particle beam 120 leaving beam separator 130 is approximately 20 degrees.

According to some embodiments, which can be combined with other embodiments described herein, the angle between the primary charged particle beam leaving the beam separator and the secondary charged particle beam entering the beam separator lies in the range from 0 to 20 degrees. For example, in the embodiment illustrated in FIG. 7, the angle between primary charged particle beam 110 leaving beam separator 130 and secondary charged particle beam 120 entering beam separator 130 is approximately 0 degrees, so that the primary and secondary charged particle beams travel along the same axis, but in opposite directions.

According to some embodiments, which can be combined with other embodiments described herein, the landing energy lies in the range from 0.05 keV to 30 keV.

Embodiments described herein relate to a charged particle beam device, such as e.g. charged particle beam device shown in FIG. 7. The charged particle beam device includes a beam emitter, such as e.g. beam emitter 101 shown in FIG. 7, for emitting a primary charged particle beam. The charged particle beam device further includes a sample voltage source, such as e.g. sample voltage source 440 shown in FIG. 7. The sample voltage source is configured for applying a sample voltage to a sample to adjust a landing energy of the primary charged particle beam on the sample. The charged particle beam device further includes a beam separator, such as e.g. beam separator 130 shown in FIG. 7, including an electrostatic beam separation portion and a magnetic beam separation portion.

The charged particle beam device further includes a processing unit, such as e.g. processing unit 710 shown in FIG. 7. The processing unit is configured to calculate the first electric current value and the first voltage value from the primary reference angle, the secondary reference angle and a first value of the sample voltage.

The charged particle beam further includes an electric current source, such as e.g. electric current source 430 shown in FIG. 7, adapted for creating an electric current in the magnetic beam separation portion, the electric current being set to the first electric current value to generate a first magnetic field. The charged particle beam further includes a voltage source, such as e.g. voltage source 420 shown in FIG. 7, adapted for applying a voltage to the electrostatic beam separation portion, the voltage being set to the first voltage value to generate a first electric field.

If the electric current created in the magnetic beam separation portion is set to the first electric current value and the voltage applied to the electrostatic beam separation portion is set to the first voltage value, the beam separator separating the primary charged particle beam from the secondary charged particle beam is configured for: deflecting the primary charged particle beam by the primary reference angle under the influence of the first electric field and the first magnetic field; and deflecting the secondary charged particle beam by the secondary reference angle under the influence of the first electric field and first the magnetic field.

According to some embodiments, which can be combined with other embodiments described herein, the charged particle beam device further includes a dispersion compensation element, such as e.g. dispersion compensation element 610 shown in FIG. 7. The dispersion compensation element may be adapted to act on the primary charged particle beam and may be disposed, relative to the primary charged particle beam, upstream of the beam separator. The dispersion compensation element may have an adjustable dispersion for compensating a dispersion of the beam separator. The dispersion of the beam separator may be introduced in the primary charged particle beam by the beam separator.

According to some embodiments, which can be combined with other embodiments described herein, the dispersion compensation element includes a magnetic dispersion compensation portion and an electrostatic dispersion compensation portion, such as e.g. magnetic dispersion compensation portion 612 and electrostatic dispersion compensation portion 611 shown in FIG. 7, respectively.

The dispersion compensation element may be adapted for deflecting the primary charged particle beam at a deflection angle, such as e.g. deflection angle 620 shown in FIG. 7, and the dispersion of the dispersion compensation element may be adjustable independently of the deflection angle of the primary charged particle beam.

The beam separator may define a first optical axis, such as e.g. optical axis 410 shown in FIG. 7, and the dispersion compensation element may define a second optical axis, such as e.g. optical axis 650 shown in FIG. 7. The second optical axis may be parallel to the first optical axis as shown in FIG. 7. Alternatively, the second optical axis may be tilted with respect to the first optical axis. The second optical axis may be disposed at an off-set with respect to the first optical axis. The off-set may lie in the range from 1 to 15 mm.

According to some embodiments, which can be combined with other embodiments described herein, the charged particle beam device is adapted to perform embodiments of the method described herein. Further embodiments relate to the use of a charged particle beam device as described herein to perform the methods of operating a charged particle beam device described herein.

While the foregoing is directed to some embodiments of the invention, other and further embodiments may be devised without departing from the scope determined by the claims that follow.

The invention claimed is:

1. A method of operating a charged particle beam device, the charged particle beam device including a beam separator that defines an optical axis and includes a magnetic beam separation portion and an electrostatic beam separation portion, the method comprising:
generating a primary charged particle beam;
applying a voltage to a sample, the voltage being set to a first value to determine a first landing energy of the primary charged particle beam;
creating an electric current in the magnetic beam separation portion, the current being set to a first value to generate a first magnetic field;
applying a voltage to the electrostatic beam separation portion, the voltage being set to a first value to generate a first electric field;
guiding the primary charged particle beam to the beam separator, wherein the primary charged particle beam enters the beam separator at a first angle relative to the optical axis and, under the influence of the first magnetic field and the first electric field, leaves the beam separator at a second angle relative to the optical axis;
generating a secondary charged particle beam by impingement of the primary charged particle beam on the sample to which the voltage with the first value is applied;
separating the secondary charged particle beam from the primary charged particle beam in the beam separator, wherein the secondary charged particle beam enters the beam separator at a third angle relative to the optical axis and, under the influence of the first magnetic field and the first electric field, leaves the beam separator at a fourth angle relative to the optical axis, wherein the first angle and the fourth angle are different; thereafter
applying the voltage to the sample, the voltage being set to a second value to determine a second landing energy of the primary charged particle beam, the second value being different from the first value;
calculating a second value for the electric current to generate a second magnetic field;
creating the electric current in the magnetic beam separation portion, the electric current being set to the second value to generate the second magnetic field;
calculating a second value for the voltage to generate a second electric field;
applying the voltage to the electrostatic beam separation portion, the voltage being set to the second value to generate the second electric field, wherein the second value for the second magnetic field and the second value for the second electric field are calculated so that the second angle and the fourth angle remain substantially constant with the change from the first landing energy to the second landing energy;
guiding the primary charged particle beam to the beam separator, wherein the primary charged particle beam enters the beam separator at the first angle relative to the optical axis and, under the influence of the second magnetic field and the second electric field, leaves the beam separator at the second angle relative to the optical axis;
generating the secondary charged particle beam by impingement of the primary charged particle beam on the sample to which the voltage with the second value is applied; and
separating the secondary charged particle beam from the primary charged particle beam in the beam separator, wherein the secondary charged particle beam enters the beam separator at the third angle relative to the optical axis and, under the influence of the second magnetic field and the second electric field, leaves the beam separator at the fourth angle relative to the optical axis.

2. The method according to claim 1, wherein the charged particle beam device includes a dispersion compensation element arranged, in relation to the primary charged particle beam, upstream of the beam separator, the method further comprising:
compensating, by the dispersion compensation element, a dispersion which the beam separator introduces into the primary charged particle beam.

3. The method according to claim 2, further comprising:
deflecting the primary charged particle beam in the dispersion compensation element by a deflection angle.

4. The method according to claim 1, wherein the first angle is a positive angle relative to the optical axis and the fourth angle is a negative angle relative to the optical axis.

5. The method according to claim 1, wherein the third angle equals the second angle.

6. The method according to claim 1, wherein the optical axis of the beam separator coincides with an optical axis defined by an objective lens of the charged particle beam device, and wherein the primary charged particle beam travels along the optical axis upon leaving the beam separator.

7. The method according to claim 1, wherein the optical axis of the beam separator coincides with an optical axis defined by an objective lens of the charged particle beam device, and wherein the secondary charged particle beam travels along the optical axis upon entering the beam separator.

8. The method according to claim 3, wherein the magnitude of the deflection angle equals the magnitude of the first angle.

9. The method according to claim 3, wherein:
the primary charged particle beam enters the dispersion compensation element parallel to the optical axis of the beam separator and the deflection angle is equal to the first angle.

10. The method according to claim 1, wherein the primary and secondary charged particle beams are electron beams, and the first and second landing energies lie in the range from 0.05 keV to 30 keV.

11. The method according to claim 1, wherein at least one of the following holds: (i) the magnitude of the first angle lies in the range from 0 to 20 degrees, (ii) the magnitude of the second angle lies in the range from 0 to 10 degrees, (iii) the magnitude of the third angle lies in the range from 0 to 5 degrees, and (iv) the magnitude of the fourth angle lies in the range from 0 to 30 degrees.

12. A method of operating a charged particle beam device, the charged particle beam device including a beam separator that includes a magnetic beam separation portion and an electrostatic beam separation portion, the method comprising:
generating a primary charged particle beam;
applying a sample voltage to a sample, the sample voltage being set to a selected sample voltage value to determine a landing energy of the primary charged particle beam;
calculating a first electric current value from a primary reference angle, a secondary reference angle and the sample voltage value, wherein the primary reference angle corresponds to a target deflection of the primary charged particle beam in the beam separator and wherein the secondary reference angle corresponds to a target deflection of a secondary charged particle beam in the beam separator;
creating an electric current in the magnetic beam separation portion, the electric current being set to the calculated first electric current value to generate a first magnetic field;
calculating a first voltage value from the primary reference angle, the secondary reference angle and the sample voltage, wherein the first electric current value and the first voltage value are calculated so that the primary reference angle and the secondary reference angle remain substantially constant with variations in the landing energy;
applying a voltage to the electrostatic beam separation portion, the voltage being set to the calculated first voltage value to generate a first electric field;
guiding the primary charged particle beam through the beam separator, wherein the primary charged particle beam is deflected in the beam separator under the influence of the first magnetic field and the first electric field, wherein the primary charged particle beam is deflected by the primary reference angle;
generating the secondary charged particle beam by impingement of the primary charged particle beam on the sample; and
separating the secondary charged particle beam from the primary charged particle beam in the beam separator, wherein the secondary charged particle beam is deflected in the beam separator under the influence of the first magnetic field and the first electric field, and wherein the secondary charged particle is deflected by the secondary reference angle.

13. The method according to claim 12, wherein the angle between the primary charged particle beam entering the beam separator and the secondary charged particle beam leaving the beam separator lies in the range from 5 to 30 degrees.

14. The method according to claim 12, wherein the angle between the primary charged particle beam leaving the beam separator and the secondary charged particle beam entering the beam separator lies in the range from 0 to 20 degrees.

15. The method according to claim 12, wherein the landing energy lies in the range from 0.05 keV to 30 keV.

16. A charged particle beam device comprising:
a beam emitter for emitting a primary charged particle beam;
a sample voltage source configured for applying a sample voltage to a sample to adjust a landing energy of the primary charged particle beam on the sample;
a beam separator comprising an electrostatic beam separation portion and a magnetic beam separation portion;
a processing unit configured to calculate a first electric current value and a first voltage value from a primary reference angle, a secondary reference angle and a first value of the sample voltage, wherein the primary reference angle corresponds to a target deflection of the primary charged particle beam in the beam separator, and the secondary reference angle corresponds to a target deflection, in the beam separator, of a secondary charged particle beam emitted by impingement of the primary charged particle beam on the sample that is biased by the first value of the sample voltage, wherein the first electric current value and the first voltage value are calculated so that the primary reference angle and the secondary reference angle remain substantially constant with variations in the landing energy;
an electric current source adapted for creating an electric current in the magnetic beam separation portion, the electric current being set to the first electric current value to generate a first magnetic field; and
a voltage source adapted for applying a voltage to the electrostatic beam separation portion, the voltage being set to the first voltage value to generate a first electric field,
wherein, if the electric current created in the magnetic beam separation portion is set to the first electric current value and the voltage applied to the electrostatic beam separation portion is set to the first voltage value, the beam separator separating the primary charged particle beam from the secondary charged particle beam is configured for:
deflecting the primary charged particle beam by the primary reference angle under the influence of the first electric field generated in the electrostatic beam separation portion and the first magnetic field generated in the magnetic beam separation portion;

deflecting the secondary charged particle beam by the secondary reference angle under the influence of the first electric field and first the magnetic field.

17. The device according to claim 16, further including a dispersion compensation element adapted to act on the primary charged particle beam and disposed, relative to the primary charged particle beam, upstream of the beam separator, the dispersion compensation element having an adjustable dispersion for compensating a dispersion of the beam separator.

18. The device according to claim 17, wherein the dispersion compensation element includes a magnetic dispersion compensation portion and an electrostatic dispersion compensation portion, and wherein the dispersion compensation element is adapted for deflecting the primary charged particle beam at a deflection angle, and the dispersion of the dispersion compensation element is adjustable independently of the deflection angle of the primary charged particle beam.

19. The device according to claim 17, wherein the beam separator defines a first optical axis and the dispersion compensation element defines a second optical axis, wherein the second optical axis is parallel to the first optical axis and disposed at an off-set with respect to the first optical axis.

20. The device according to claim 19, wherein the off-set lies in the range from 1 to 15 mm.

* * * * *